United States Patent [19]

Yamanaka

[11] Patent Number: 5,273,925
[45] Date of Patent: Dec. 28, 1993

[54] METHOD OF FABRICATING SEMICONDUCTOR MEMORY DEVICE HAVING A CYLINDRICAL CAPACITOR ELECTRODE

[75] Inventor: Koji Yamanaka, Tokyo, Japan

[73] Assignee: NEC Corporation, Tokyo, Japan

[21] Appl. No.: 788,889

[22] Filed: Nov. 7, 1991

[30] Foreign Application Priority Data

Nov. 8, 1990 [JP] Japan ................... 2-303443

[51] Int. Cl.$^5$ ............... H01L 21/70; H01L 27/00
[52] U.S. Cl. ...................... 437/52; 437/60; 437/919
[58] Field of Search ............ 437/48, 49, 52, 60, 437/919, 992, 268, 52, 919; 148/DIG. 14; 357/23.6, 51; 257/306, 296-313

[56] References Cited

U.S. PATENT DOCUMENTS

| | | | |
|---|---|---|---|
| 4,561,907 | 12/1985 | Raiau | 437/942 |
| 4,742,018 | 5/1988 | Kimura et al. | 437/52 |
| 5,047,817 | 9/1991 | Wakamiya et al. | 357/23.6 |
| 5,053,917 | 11/1991 | Miyasaka et al. | 357/51 |
| 5,071,781 | 12/1991 | Seo et al. | 437/60 |
| 5,077,688 | 12/1991 | Kumanoya et al. | 357/23.6 |
| 5,140,389 | 8/1992 | Kimura et al. | 257/300 |
| 5,219,780 | 6/1993 | Jun | 437/52 |

FOREIGN PATENT DOCUMENTS

| | | |
|---|---|---|
| 1-120050 | 5/1989 | Japan . |
| 2-060162 | 2/1990 | Japan . |
| 2-94558 | 4/1990 | Japan ........... 437/52 |
| 2-260453 | 10/1990 | Japan . |
| 2-267962 | 11/1990 | Japan ........... 437/52 |

*Primary Examiner*—Olik Chaudhuri
*Assistant Examiner*—H. Jey Tsai
*Attorney, Agent, or Firm*—Sughrue, Mion, Zinn Macpeak & Seas

[57] ABSTRACT

A method of fabricating capacitor electrodes in a stacked type of a dynamic random access memory (DRAM) is disclosed. This method of fabricating the capacitor electrodes of a storage capacitor in the semiconductor memory device having a memory cell comprising a MOS transistor and a storage capacitor includes the steps of forming a highly doped polysilicon film, patterning the highly doped polysilicon film in a predetermined shape, forming a lightly doped polysilicon film so as to cover the surface of the highly doped polysilicon film, and anisotropically etching the lightly doped polysilicon film. A cylindrical capacitor electrode having a bottom portion in a stacked type of memory cell can be easily formed. By increasing the height of the cylindrical portion, the area of the electrodes opposing with each other of the storage capacitor can be also easily increased.

5 Claims, 5 Drawing Sheets

METHOD OF FABRICATING SEMICONDUCTOR MEMORY DEVICE HAVING A CYLINDRICAL CAPACITOR ELECTRODE

BACKGROUND OF THE INVENTION

(1) Field of the Invention

The present invention relates to a method of fabricating a semiconductor memory device and, more particularly, to a method of fabricating a storage capacitor in a stacked type of a dynamic random-access memory (hereinafter referred to as "DRAM").

(2) Description of the Related Art

Conventionally, in many cases, DRAM adopts a memory cell composed of one transistor serving as a switch and one storage capacitor. The DRAM designed in such a structure includes a stacked type memory cell.

FIGS. 1A to 1E are sectional views for explaining the method of fabricating the conventional stacked type memory cell in the order of its fabricating steps.

First, as seen from FIG. 1A, formed on a silicon substrate 1 are a field oxide film 2, a gate insulating film 3, gate electrodes 4, source/drain regions 5 and first insulating films 6 covering the gate electrodes 4.

As seen from FIG. 1B, a second insulating film 7 is formed on the entire outer (upper) surface using chemical vapor deposition (CVD) techniques (hereinafter simply referred to as "CVD"), and thereafter a contact hole 8 is opened at the position corresponding to a storage capacitor by photolithography and reactive ion-etching (RIE) techniques (hereinafter simply referred to as "RIE").

As seen from FIG. 1C, a polysilicon (also called polycrystalline silicon) film is formed by the CVD, and further a capacitor storage electrode 20 of the polysilicon film is formed by the RIE using a photoresist film 9 as a mask.

As seen from FIG. 1D, a dielectric film 12 is formed on the resultant surface, and subsequently a capacitor opposing electrode 13 of a polysilicon film is formed. The capacitor opposing electrode 13 is formed so as to cover the capacitor storage electrode 20, and the dielectric film 12 is etched using the capacitor opposing electrode 13 as a mask.

Finally, as seen from FIG. 1E, a third insulating film 14 serving as an inter-layer insulating film is formed by the CVD, and thereafter the third insulating film 14 and the second insulating film 7 on the source/drain region 5 are selectively removed to open a contact hole for a bit followed by the formation of a metal wiring 15.

The above conventional stacked type memory cell has the following defects. For the storage capacitor to have a large capacitance, the level difference in the gate electrodes 4 is used to increase the surface area of the capacitor storage electrode 20. Further, the thickness of the polysilicon film of the capacitor storage electrode 20 is made as thin as possible in order to facilitate easy etching on the portion having the level difference. For example, the polysilicon film having the thickness in the order of 200 nm was used at an early stage. However, if the capacitor storage electrode 20 is thin, its side area counts small in terms of an increase in the surface area.

As the memory cell area is made smaller, the pattern of the capacitor storage electrode 20 must be made smaller. Therefore, it is not possible to secure a sufficient area for the capacitor if only the surface of the capacitor storage electrode 20 is used in such a structure.

SUMMARY OF THE INVENTION

It is, therefore, an object of the invention to overcome the above defects in the conventional method and to provide an improved method of fabricating a semiconductor memory device which provides an increased area for a storage capacitor.

In order to attain the above object, in accordance with one aspect of the present invention, there is provided a method of fabricating capacitor electrodes in the semiconductor memory device having a memory cell comprising one MOS transistor serving as a switch and a storage capacitor connected with one of its source and drain regions, the method comprises the steps of:
 forming a highly doped polysilicon film;
 patterning the highly doped polysilicon film into a predetermined shape;
 forming a lightly doped polysilicon film to cover the surface of the highly doped polysilicon film having the predetermined shape; and
 anisotropically etching the lightly doped polysilicon film.

According to another aspect of the present invention, there is also provided a method of fabricating capacitor electrodes in the semiconductor memory device having a memory cell comprising one MOS transistor serving as a switch and a storage capacitor connected with one of its source and drain regions, the method comprises the steps of:
 forming a first conductive film;
 forming a deposition film on the first conductive film;
 patterning the deposition film and the first conductive film into predetermined shapes;
 forming a second conductive film to cover the deposition film and the first conductive film having the predetermined shapes; and
 anisotropically etching the second conductive film.

BRIEF DESCRIPTION OF THE DRAWINGS

The above and other objects, features and advantages of the present invention will be apparent from the following description of preferred embodiments of the invention, with reference to the accompanying drawings, in which.

DESCRIPTION OF THE PREFERRED EMBODIMENTS

Figure 1A:
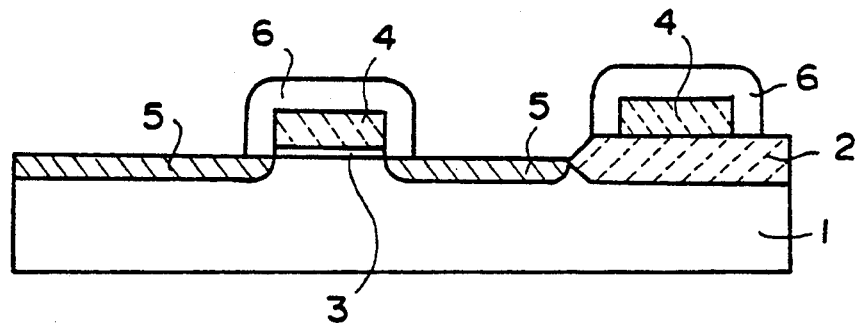
FIGS. 1A to 1E are sectional views showing the steps in the semiconductor memory device fabricating process according to the prior art.
Figure 1B:
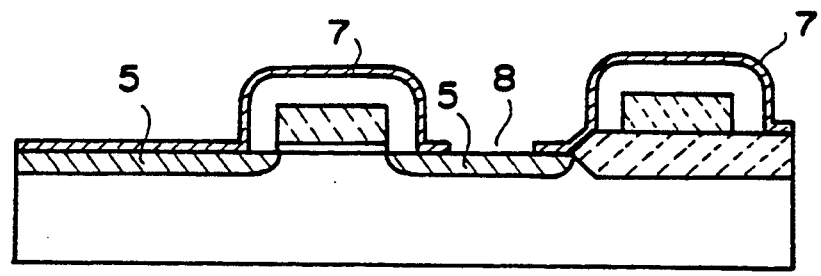
Figure 1C:
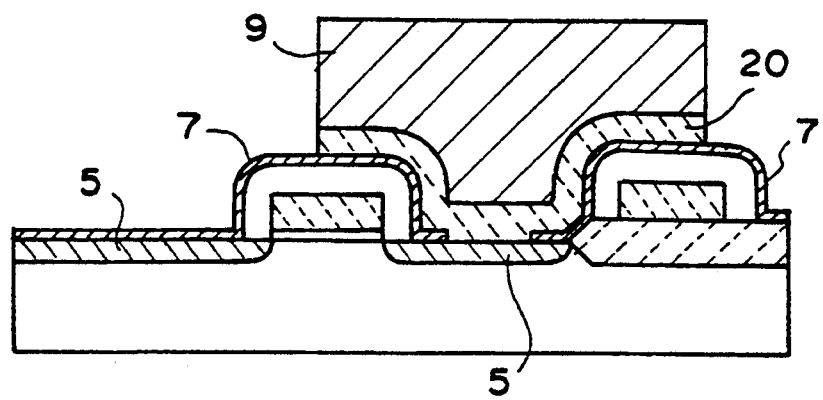
Figure 1D:
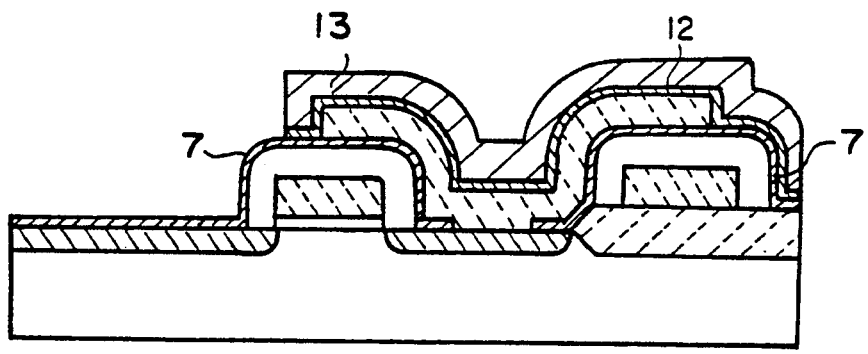
Figure 1E:
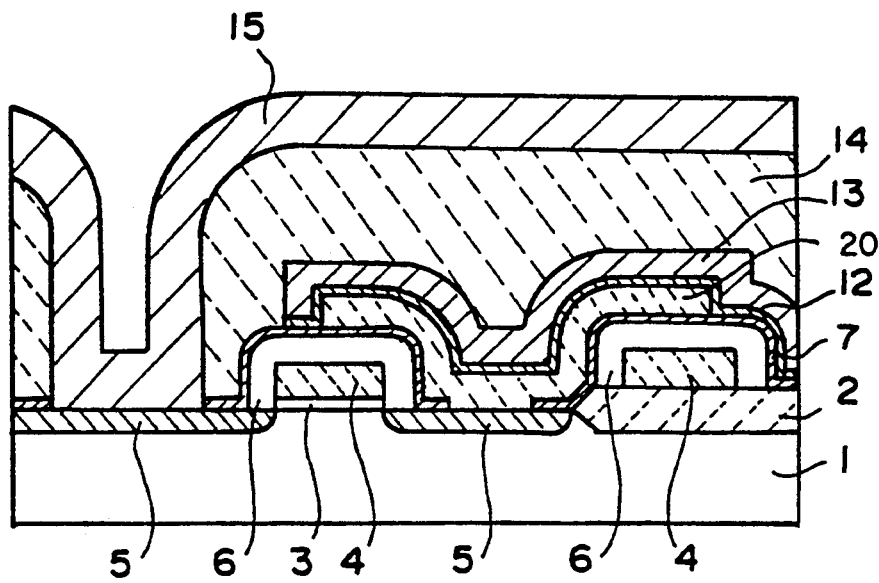

Now, referring to the drawings, embodiments of the present invention will be explained below. Please note that, throughout the specification of the invention, the same reference numerals refer to the same or like elements in all the figures of the drawings.

FIGS. 2A to 2E show the fabricating process according to the first embodiment in the order of its steps.

Figure 2A:
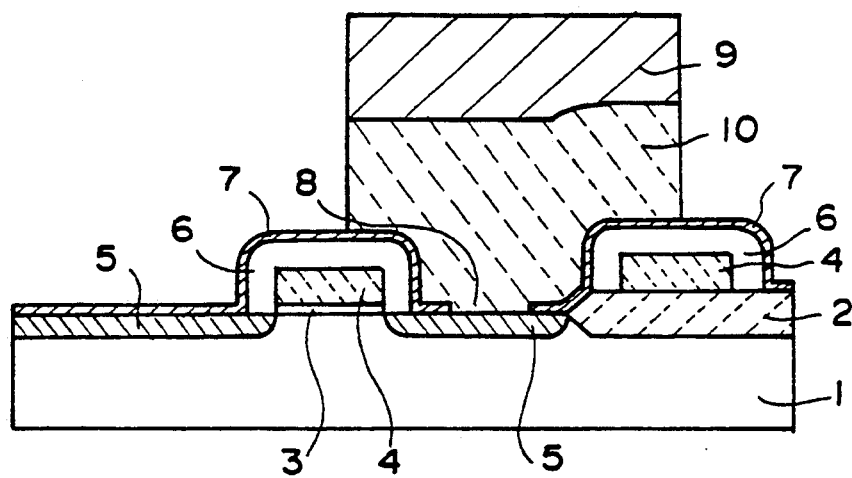
FIGS. 2A to 2E are sectional views showing the steps in the semiconductor memory device fabricating process according to a first embodiment of the present invention.

First, as seen from FIG. 2A, a field oxide film 2 is formed on, e.g., a p-type silicon substrate 1. After a gate insulating film 3 is formed on an element area, gate electrodes 4 of a polysilicon film are formed on predetermined areas. N+-type source/drain regions 5 are formed by ion-implantation using the gate electrodes 4 as masks. After a silicon oxide film is grown on the entire upper surface, it is etched back by the RIE using mixed gas of, e.g., $CHF_4$ and $O_2$ thereby to form a first insulating film 6 covering the gate electrodes 4. Further, after a second insulating film 7 is formed on the entire upper surface by the CVD, a contact hole 8 is opened.

Subsequently, after a polysilicon film having the thickness of, e.g., 600 nm is grown, it is highly doped with n-type impurities such as phosphorus (P) by diffusion or ion-implantation. A photoresist 9 having a predetermined pattern is formed on the surface of the above n+-type polysilicon film. The n+-type polysilicon film is etched by the RIE using the photoresist 9 as a mask thereby to form a first capacitor storage electrode 10 of the n+-type polysilicon film.

Figure 2B:
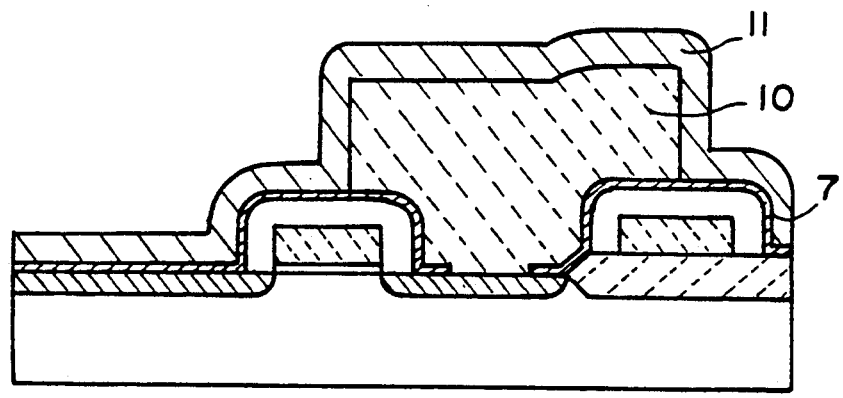

As seen from FIG. 2B, after the photoresist 9 is removed, a polysilicon film is grown to a thickness of, e.g., 100 nm on the entire upper surface. Further, the polysilicon film is lightly doped with n-type impurities such as phosphorus (P) by diffusion or ion-implantation thereby to form a second capacitor storage electrode 11 of the n-type polysilicon film. In this case, it should be noted that with respect to this second capacitor storage electrode 11, doping of n-type impurities is carried out at a lower concentration than in the first capacitor storage electrode 10 so that dry etching by, e.g., RIE is to be executed at a lower speed than in the first capacitor storage electrode 10.

Figure 2C:
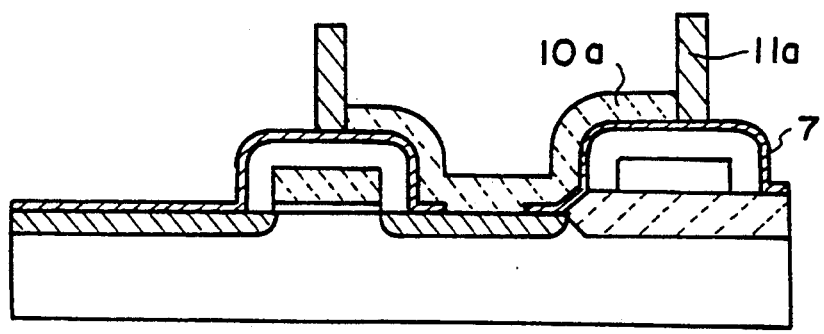

As seen from FIG. 2C, anisotropic etching by, e.g., the RIE is carried out for a time longer than the time required to remove the second capacitor storage electrode 11 which has been formed on the upper surface of the first capacitor storage electrode 10. Thus, after the initial second capacitor storage electrode 11 formed on the first initial capacitor storage electrode 10 is removed, etching for the first capacitor storage electrode 10 proceeds at a relatively high speed. As a result, only a part 10a of the first capacitor storage electrode 10 and a part 11a of the second capacitor storage electrode 11 which is formed at each of the two sides of the first storage electrode 10 are left. Accordingly, the capacitor storage electrode is constituted by both the first capacitor storage electrode 10a and the second capacitor storage electrode 11a in such a structure that the former defines a bottom portion and the latter defines a cylindrical portion of the storage capacitor.

Figure 2D:
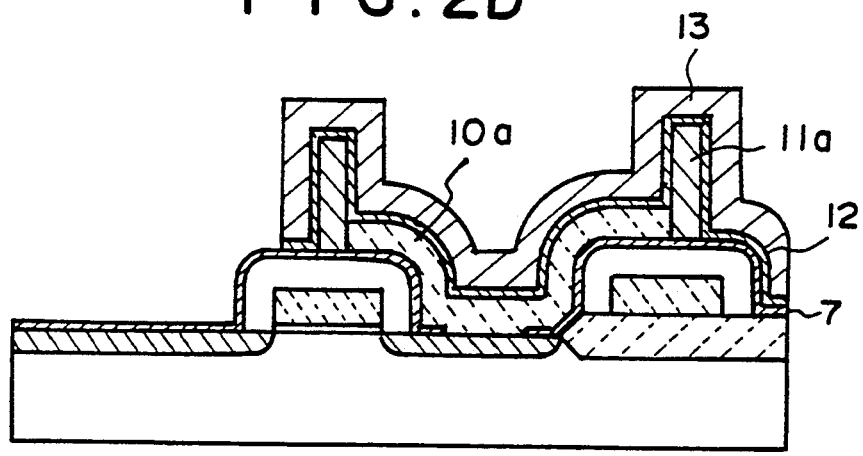

As seen from FIG. 2D, a dielectric film 12 and a capacitor opposing electrode 13 of a polysilicon film are successively formed on the above composite capacitor storage electrode for them to have predetermined shapes.

Figure 2E:
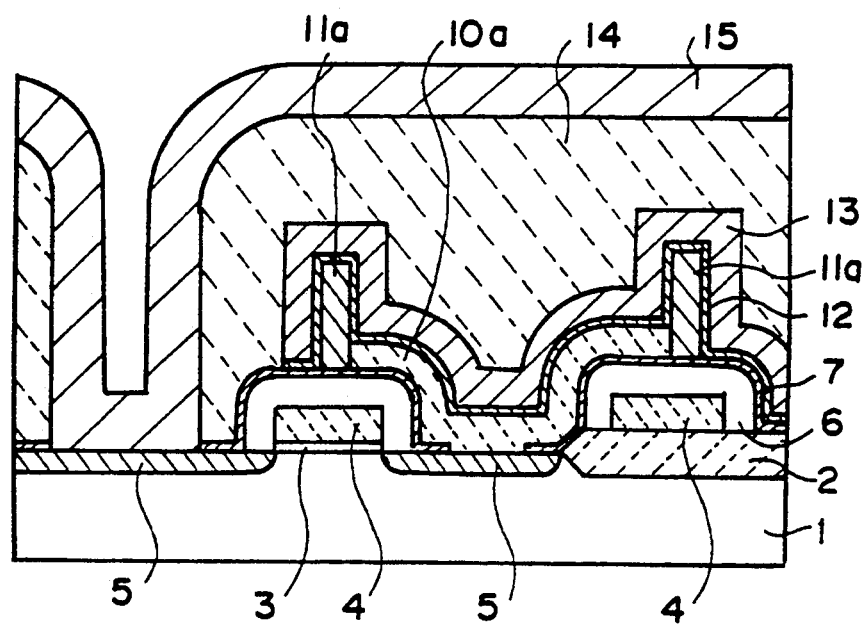

Finally, as seen from FIG. 2E, after a third insulating film 14 is deposited on the resultant surface, a contact hole for a bit is opened to reach the source/drain region 5 and a metal wiring 15 of, e.g., aluminum is provided on the contact hole.

Figure 3A:
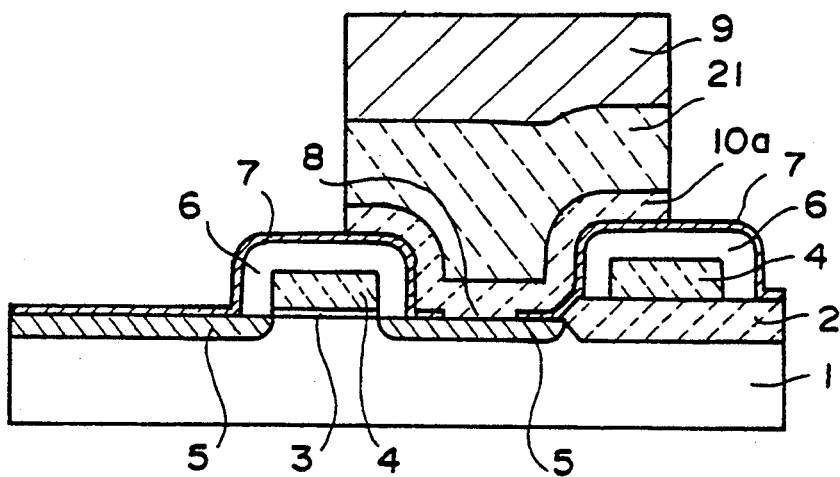
FIGS. 3A to 3C are sectional views showing the steps in the semiconductor memory device fabricating process according to a second embodiment of the present invention.
Figure 3B:
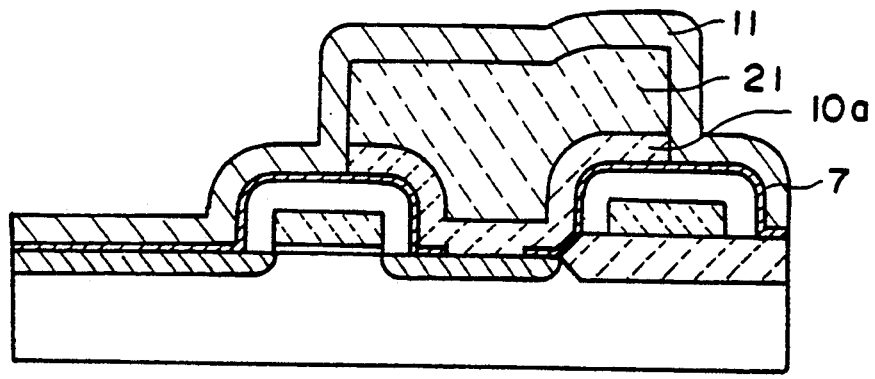
Figure 3C:
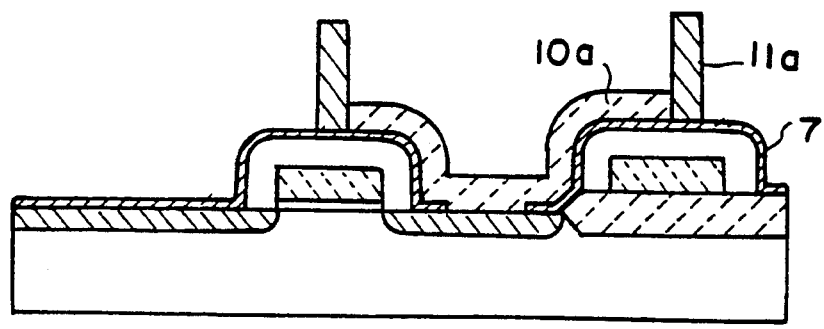

FIGS. 3A to 3C show the fabricating process according to the second embodiment in the order of its steps.

First, as seen from FIG. 3A, a field oxide film 2 is formed on, e.g., a p-type silicon substrate 1. After a gate insulating film 3 is formed on element areas, gate electrodes 4 of a polysilicon film are formed on predetermined areas. N+-type source/drain regions 5 are formed by ion-implantation using the gate electrodes 4 as masks. After a silicon oxide film is grown on the entire upper surface, it is etched back by the RIE using a mixed gas of, e.g., $CHF_4$ and $O_2$ thereby to form a first insulating film 6 covering the gate electrodes 4. Further, after a second insulating film 7 is formed on the entire upper surface by the CVD, a contact hole 8 is opened.

Subsequently, a tungsten (W) film is formed on the source/drain region 5 with the contact hole 8, and further a deposition film 21 of a polysilicon film is grown to a predetermined thickness thereon. A photoresist 9 having a predetermined pattern is applied to the resultant surface. Using the photoresist 9 as a mask, the deposition film 21 and the tungsten film are etched by the RIE so that the first capacitor storage electrode 10a of the tungsten film is formed.

Next, as seen from FIG. 3B, after the photoresist 9 is removed, another tungsten film having a thickness of, e.g., 100 nm is deposited to form an initial second capacitor storage electrode 11.

As seen from FIG. 3C, anisotropic etching by the RIE using mixed gas containig fluorine (F) is carried out to remove the deposition film 21 and to form an actual second capacitor storage 11a. Accordingly, the capacitor storage electrode is constituted by both the first capacitor storage electrode 10a and the second capacitor storage electrode 11a in such a structure that the former defines a bottom portion and the latter defines a cylindrical portion of the storage capacitor. Here, it should be noted that the etching speed of the polysilicon film is higher than the tungsten film. For this reason, in this anisotropic etching process, immediately after the second capacitor storage electrode 11 on the deposition film 21 is removed, the deposition film 21 will be etched at a high speed. In this case, the first capacitor storage electrode 10a serves as a stopper for the etching for the deposition film 21 so that the composite capacitor storage electrode according to this embodiment having a shape can be formed more easily than in the first embodiment of the present invention.

Additionally, although in this embodiment, tungsten (W) is used as the material for the first and second capacitor storage electrodes 10a and 11a, other refractory metals such as molybdenum (Mo) and titanium (Ti) may well be used. Further, the first and second capacitor storage electrodes may not be made of the same material but may be made of a combination of these materials. Although the deposition film is made of a polysilicon film, it may be made of any other material as long as its etching speed is higher than that of the first and the second capacitor storage electrode.

As readily understood from the explanation hitherto made, in accordance with the method of fabricating a semi-conductor memory device according to the present invention, a cylindrical capacitor storage electrode having a bottom portion in a stacked type of memory cell can be easily formed. Therefore, by increasing the height of the cylindrical portion, the area of the electrodes opposing with each other of a capacitor can also be easily increased so that capacitance value is effectively increased.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method of fabricating capacitor electrodes in the semiconductor memory device having a memory cell comprising a MOS transistor serving as a switch and a storage capacitor connected with one of its source and drain regions, said method comprising the steps of:

forming a highly doped polysilicon film;

patterning and etching said highly doped polysilicon film;

forming a lightly doped polysilicon film to cover the surface of said highly doped polysilicon film; and anisotropically etching said lightly doped polysilicon film using a lower etching speed and then etching said highly doped polysilicon film using a higher etching speed, higher than said lower etching speed, to form a composite capacitor electrode of said storage capacitor, said composite capacitor electrode being formed by a bottom portion of said highly doped polysilicon film and a cylindrical portion of said lightly doped polysilicon film.

2. A method of fabricating capacitor electrodes in a semiconductor memory device having a memory cell comprising an MOS transistor serving as a switch and a storage capacitor connected with one of its source and drain regions, said method comprising the steps of:

forming a first conductive film:

forming a deposition film on said first conductive film;

patterning 2nd etching said deposition film and said first conductive film;

forming a second conductive film to cover said deposition film and said first conductive film; and anisotropically etching said second conductive film using an etchant whose etching speed for said second conductive film is lower than that for said deposition film, and removing said second conductive film on the deposition film and said deposition film in the same etching process while leaving in place a portion of said second conductive film, to form a composite capacitor electrode of said storage capacitor, said composite capacitor electrode being formed by a bottom portion of said first conductive film and a cylindrical portion constituted by said portion of said second conductive film left in place.

3. A method of fabricating capacitor electrodes according to claim 2, wherein said first and said second conductive film are made of at least one selected from the group consisting of tungsten (W), molybdenum (Mo) and titanium (Ti).

4. A method of fabricating capacitor electrodes according to claim 2, wherein said first and said second conductive film are made of different refractory metals.

5. A method of fabricating capacitor electrodes according to claim 2, wherein the etching speed of said deposition film is higher than that of said first and said second conductive film.

* * * * *

UNITED STATES PATENT AND TRADEMARK OFFICE
CERTIFICATE OF CORRECTION

PATENT NO. : 5,273,925
DATED : December 28, 1993
INVENTOR(S) : Koji Yamanaka

It is certified that error appears in the above-indentified patent and that said Letters Patent is hereby corrected as shown below:

Column 4, line 23, delete "containig" and insert --containing--;

Column 6, line 1, delete "2nd" and insert --and --;

Signed and Sealed this

Nineteenth Day of July, 1994

Attest:

BRUCE LEHMAN

Attesting Officer Commissioner of Patents and Trademarks